United States Patent
Salle et al.

(10) Patent No.: US 10,579,021 B2
(45) Date of Patent: Mar. 3, 2020

(54) SYSTEM AND METHOD FOR CALIBRATING A TIME TO DIGITAL CONVERTER DEVICE

(71) Applicant: NXP USA, INC., Austin, TX (US)

(72) Inventors: Didier Salle, Toulouse (FR); Olivier Vincent Doaré, La Salvetat de Gilles (FR); Birama Goumballa, Larra (FR); Cristian Pavao Moreira, Frouzins (FR)

(73) Assignee: NXP USA, Inc., Austin, TX (US)

( * ) Notice: Subject to any disclaimer, the term of this patent is extended or adjusted under 35 U.S.C. 154(b) by 122 days.

(21) Appl. No.: 15/599,571

(22) Filed: May 19, 2017

(65) Prior Publication Data

US 2018/0164748 A1   Jun. 14, 2018

(30) Foreign Application Priority Data

Dec. 8, 2016   (EP) .................................. 16306647

(51) Int. Cl.
| | | |
|---|---|---|
| *G04F 10/00* | (2006.01) | |
| *H03M 1/50* | (2006.01) | |
| *H03L 7/085* | (2006.01) | |
| *H03L 7/099* | (2006.01) | |
| *H03K 5/159* | (2006.01) | |

(52) U.S. Cl.
CPC .......... *G04F 10/005* (2013.01); *H03K 5/159* (2013.01); *H03L 7/085* (2013.01); *H03L 7/0991* (2013.01); *H03M 1/50* (2013.01)

(58) Field of Classification Search
CPC .. H03K 5/159; H03L 7/06; H03L 7/08; H03L 7/0814; H03L 7/085; H03L 7/087; H03L 7/091; H03L 7/095; H03L 7/099; H03L 7/0991; H03L 7/0992; H03L 7/18; H03M 1/50; H04L 7/033; H04L 7/0331
USPC ....... 375/226, 257, 326, 327, 371, 373, 375, 375/376; 327/146, 147, 154–156, 236
See application file for complete search history.

(56) References Cited

U.S. PATENT DOCUMENTS

| | | | | |
|---|---|---|---|---|
| 4,317,228 A | * | 2/1982 | Hendrickson | ........... H03L 7/199 331/18 |
| 8,779,812 B1 | * | 7/2014 | Kavanagh | ............... H03L 7/087 327/150 |
| 8,976,053 B1 | | 3/2015 | Zhang et al. | |
| 2006/0003720 A1 | * | 1/2006 | Lee | ......... H03L 7/085 455/264 |
| 2006/0103566 A1 | | 5/2006 | Vemulapalli et al. | |
| 2007/0160164 A1 | * | 7/2007 | Sahota | ..... H03C 5/00 375/295 |
| 2009/0201065 A1 | * | 8/2009 | Kuwano | .......... H03L 7/10 327/299 |
| 2009/0309664 A1 | * | 12/2009 | Gotz | ......... H03L 7/085 331/16 |
| 2012/0056769 A1 | | 3/2012 | Wang et al. | |

(Continued)

*Primary Examiner* — Young T Tse (57) ABSTRACT

A Time to Digital converter (TDC) may have a Vernier architecture of multiple successive modules arranged in series. Each of the modules may output an indication of a differential in phase between two received signals. Each module may include two signal lines for the received signals, and it may be desirable to calibrate the two signal lines. To this end, a signal output from a proceeding module may be provided to both signal lines of a succeeding module and used as a reference or calibration signal to calibrate the two signal lines of the module.

12 Claims, 4 Drawing Sheets

(56) References Cited

U.S. PATENT DOCUMENTS

2016/0156362 A1 6/2016 Kim et al.
2018/0341230 A1* 11/2018 Wiezell ................ H03L 7/0802

* cited by examiner

SYSTEM AND METHOD FOR CALIBRATING A TIME TO DIGITAL CONVERTER DEVICE

CROSS-REFERENCE TO RELATED APPLICATIONS

This application claims the priority under 35 U.S.C. § 119 of European Patent application No. 16306647.5, filed on 8 Dec. 2016, the contents of which are incorporated by reference herein.

BACKGROUND

Field of the Disclosure

This disclosure generally relates to electronic devices and more particularly relates to time to digital converter devices.

Background of the Invention

Digital Phase Locked Loops (PLLs) can use a Time-to-Digital converter (TDC) in their feedback path to quantify the delay between a reference signal and the signal output provided by the Digital Controlled Oscillator (DCO) of the PLL. Thus, the TDC serves as the Phase Frequency Detector (PFD) in the feedback path of the PLL. Conductors, such as metal traces in radio frequency circuits, which include TDC devices, have a reactance that delays propagation of signals along their length.

SUMMARY

According to a first aspect, there is provided a time to digital converter (TDC) comprising: a plurality of modules arranged with a Vernier architecture, comprising a first module and a second module, each module comprising a first input to receive an input frequency signal having a particular frequency, a second input to receive an input reference frequency to be compared to the input frequency signal, a first output to provide an output frequency signal based on the input frequency signal, and a second output to provide an output reference frequency signal; and a signal selector comprising a first input coupled to the first output of the first module, a second input coupled to the second output of the first module, a select line to selectively provide a signal at one of the first and second inputs of the signal selector to an output of the signal selector, the output of the signal selector coupled to one of the first input of the second module and the second input of the second module.

The second module may further comprise a first set of tuning capacitances configured to be selectively connected to a one of a signal line or a reference frequency line traversing the second module to modify a capacitance of the one of the signal line or the reference frequency line. The TDC may further comprise a first pair of buffers coupled to the device frequency line to isolate the first set of tuning capacitances. The TDC may further comprise a second set of tuning capacitances configured to be coupled or uncoupled to a one of a signal line or a reference frequency line traversing the second module to modify a capacitance of the one of the signal line or the reference frequency line. The TDC may further comprise a second pair of buffers coupled to the reference frequency line to isolate the second set of tuning capacitances.

The TDC may further comprise an arbiter coupled to the device frequency line subsequent to the first set of tuning capacitances. The arbiter may comprise a flip-flop device. The signal selector may comprise a multiplexer. The TDC may further comprise a preceding signal selector with a first input, a second input, and an output, wherein the preceding signal selector immediately precedes the first module and the output of the preceding signal selector is coupled to a device frequency line of the first module and a reference frequency signal is coupled to the second input and a reference frequency input of the first module. The TDC may further comprise a third set of tuning capacitances configured to be coupled or uncoupled to a device frequency line of the first module in a region of the device frequency line of the first module to modify a capacitance of the device frequency line of the first module. The TDC may further comprise a first module arbiter coupled to the device frequency line of the first module interior to the first module and subsequent to the third set of tuning capacitances.

According to a second aspect, there is provided a Phase Locked Loop (PLL) circuit, comprising: a phase comparator; a controlled oscillator configured to generate a first signal at a first frequency; and a time to digital converter (TDC) with a Vernier architecture, the TDC coupled to the controlled oscillator and comprising: a first circuit configured to output a device frequency signal on a first conductor and a reference frequency signal on a second conductor, a succeeding circuit succeeding the first circuit and comprising a device frequency line and a reference frequency line, and a succeeding signal selector with a first input, a second input, and an output, wherein the output is coupled to the reference frequency line, the first input is coupled to the first conductor and the second input is coupled to the second conductor.

The PLL may further comprise a first set of tuning capacitances configured to be coupled or uncoupled to one of the device frequency line or reference frequency line to modify a capacitance of the one of the device frequency line or reference frequency line. The PLL may further comprise a first pair of buffers coupled to the device frequency line to isolate the first set of tuning capacitances. The PLL may further comprise a second set of tuning capacitances configured to be coupled or uncoupled to one of the device frequency line or the reference frequency line to modify a capacitance of the one of the device frequency line or reference frequency line.

The PLL circuit may further comprise an arbiter coupled to the device frequency line subsequent to the first set of tuning capacitances. The PLL circuit may further comprise a preceding signal selector with a first input, a second input, and an output, wherein the preceding signal selector immediately precedes the first circuit and the output of the preceding signal selector is coupled to a reference frequency line of the first circuit and a reference frequency signal is coupled to the second input and a reference frequency input of the first circuit.

The PLL circuit may further comprise a third set of tuning capacitances configured to be coupled or uncoupled to the device frequency line of the first circuit in a region of the device frequency line of the first circuit to modify a capacitance of the device frequency line of the first circuit. The PLL circuit may further comprise a first circuit arbiter coupled to the device frequency line of the first circuit interior to the first circuit and subsequent to the third set of tuning capacitances.

According to a third aspect, there is provided a time to digital converter (TDC) with a Vernier architecture, the TDC comprising: a set of modules arranged in series succession, each of the modules having a first signal line traversing the module and a second signal line traversing the module; and a set of signal selectors arranged in series succession and interposed between the modules, each signal selector having a first input, a second input, and an output, wherein the first input is coupled to receive a first signal from the first signal line of an immediately preceding module and the second input is coupled to receive a second signal from the second signal line of the preceding module and the signal selector is configured to select one of the first or second signals to provide to the first signal line of an immediately succeeding module.

According to a fourth aspect, there is provided a method comprising: entering a calibration mode for calibrating a time to digital converter (TDC) having a plurality of modules arranged with a Vernier architecture, comprising a first module and a second module, each module comprising a first input to receive an input frequency signal having a particular frequency, a second input to receive an input reference frequency to be compared to the input frequency signal, a first output to provide an output frequency signal based on the input frequency signal, and a second output to provide an output reference frequency signal; decoupling the first output of the first module from the first input of the second module with a signal selector upon entering the calibration mode, the signal selector comprising a first input coupled to the first output of the first module, a second input coupled to the second output of the first module; and connecting the second output of the first module to the first input of the second module with the signal selector in response to a calibration signal being provided to the signal selector upon entering the calibration mode.

The method may further comprise selectively connecting tuning capacitances of a first set of tuning capacitances to a one of a device signal line or a reference frequency line traversing the second module to modify a capacitance of the one of the device signal line or the reference frequency line. A first pair of buffers may be coupled to the device signal line to isolate the first set of tuning capacitances. The method may further comprise selectively connecting tuning capacitances of a second set of tuning capacitances to a one of a device signal line or a reference frequency line traversing the second module to modify a capacitance of the one of the device signal line or the reference frequency line. A second pair of buffers may be coupled to the reference frequency line to isolate the second set of tuning capacitances. An arbiter may be coupled to the device signal line and the reference frequency line subsequent to the first set of tuning capacitances.

DESCRIPTION OF EMBODIMENTS

The present disclosure may be better understood, and its numerous features and advantages made apparent to those skilled in the art by referencing the accompanying drawings.

Conductors, such as metal traces in radio frequency circuits, which include TDC devices, have a reactance that delays propagation of signals along their length. The reactance of a conductor can be due to an inherent capacitance and inductance. Different conducting lines may have different delays due to differences in their individual reactances. When conducting lines in a radio frequency circuit are desired to propagate signals in parallel, such as to allow for signal comparison in a TDC application, the different delays of different lines can interfere with obtaining parallel propagation, which can prevent a precise or accurate comparison of signals propagating along the lines. For example, digitization of time delay to a digital value by the TDC can introduce quantization errors due to the finite quantization resolution of the TDC. Thus, a fine time resolution TDC is desired to meet stringent phase noise applications, such as radar. Therefore, it can be desirable to calibrate conductive lines used in a high frequency control circuitry to ensure proper operation.

Each stage of a TDC having multiple stages can be individually calibrated by providing a common signal to the inputs of each of two parallel interconnect lines of the stage to be calibrated, and modifying a capacitance of at least one of the interconnect lines until the common signal propagates at the same rate along parallel paths. In a particular embodiment, such a TDC can be used in a digital PLL that is used as a frequency synthesizer in a radio frequency circuit to provide a stable local oscillator for transmitters or receivers. During operation of such a digital PLL, the TDC measures and digitalizes the phase difference between a reference or control signal and a feedback signal. An optimized TDC may operate in the GHz range, leading to a period of 500 ps to 1 ns that needs to be quantized with the fine resolution of the TDC. To this end, calibrating capacitances may be added to, or removed from, the interconnect lines in each respective module to calibrate the modules relative to themselves. In order to ensure that each of the lines in a module has same or comparable capacitance, during calibration of the module one of the output signals of the preceding module can be used to provide a common input signal to both the input signal line and the frequency reference signal line of the next module. Various aspects of the present disclosure will be better understood with reference to FIGS. 1-4.

Figure 1:
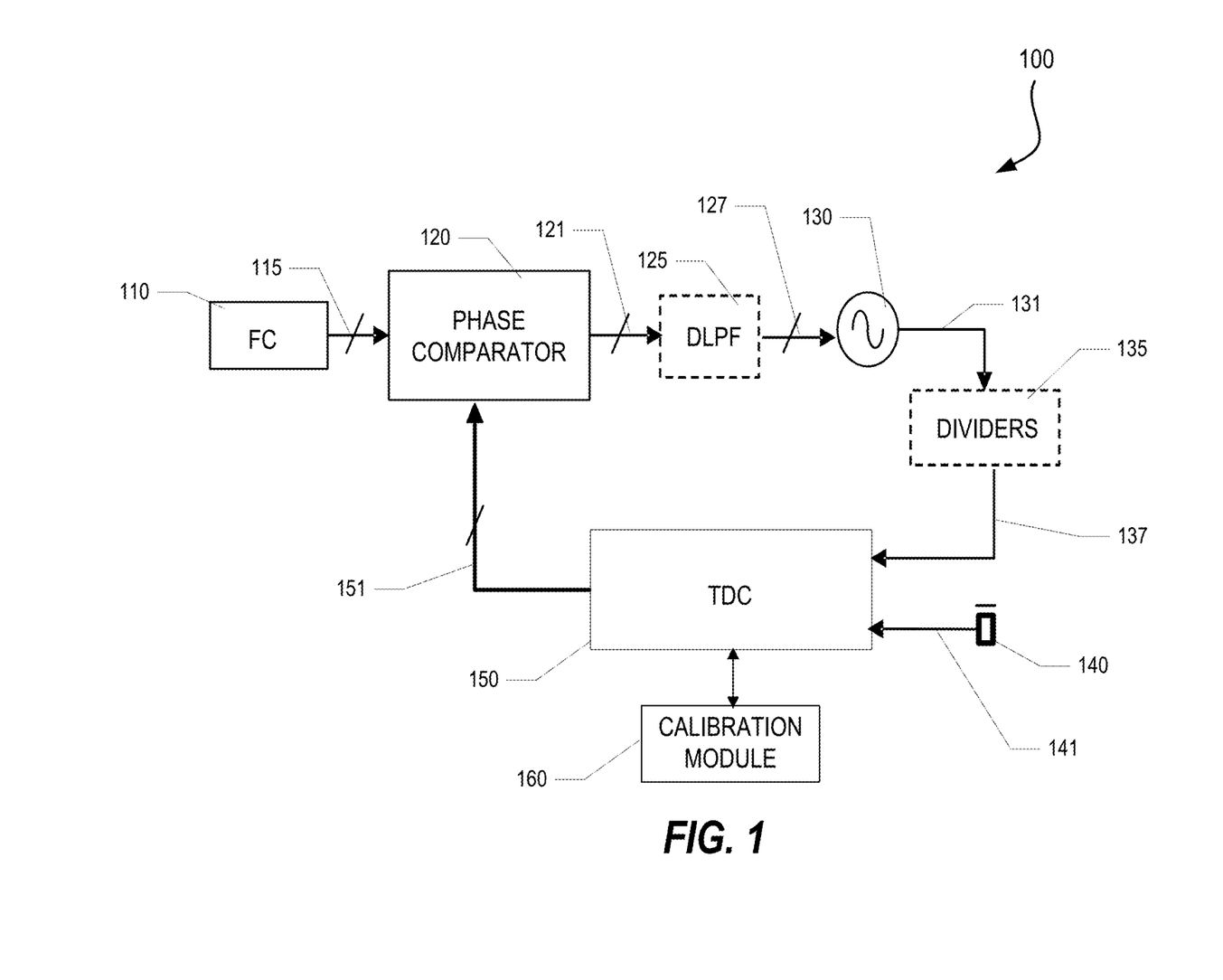
FIG. 1 is an example of a Phase Locked Loop, in accordance with embodiments disclosed herein.

FIG. 1 illustrates a digital PLL 100 including a TDC device 150 that can be calibrated as described herein. Digital PLL 100 includes a frequency control circuit (FC) 110 and a feedforward path including a phase comparator 120, an optional (indicated by the dashed outline) digital low pass filter 125, and DCO 130. The feedback path of digital PLL 100 includes an optional divider 135 and TDC device 150. A reference frequency supply 140 is further connected to the TDC device 150. A calibration module 160 is connected to TDC device 150 and can be used to calibrate TDC device 150. Calibration module 160 is a circuit that can be implemented using a state machine or an instruction based data processor and memory storing instructions to be executed.

A TDC may be implemented with a Vernier architecture. In a Vernier architecture, two parallel lines conduct signals in parallel, the two parallel lines each have a series of known delays, and coupled between the lines and interposed between the delays in the lines are latches such that there is a succession of latches coupled between the two parallel lines. The lines have delays that are different within a known threshold, so that one of the lines propagates a signal faster than the other line as determined by the known difference in delays between the lines. The latches coupled between the lines latch on a specified difference in propagation between the propagating signals on the two parallel lines, allowing for the Vernier architecture to detect a difference in propagation (and thus frequency) between a signal provided to one of the parallel lines and a reference signal at a reference frequency provided to the other of the two lines to act as a control signal for comparison.

A Vernier architecture may be implemented as a succession of tiled modules arranged in series and connected so that two parallel lines traverse the modules in parallel to conduct signals across the succession of modules in parallel. Each module may have two parallel lines (which form part of the two parallel lines traversing the modules), each line having a delay, such as a buffer, which may have capacitances which may be set to provide a known reactance delay within a granularity. The module may further include a latch such as a flip-flop coupled between the two parallel lines interior to the module, and subsequent to the module delays on the two parallel lines to latch on a differential caused by a known difference between the module delays. A reference signal at a reference frequency may be provided to one of the parallel lines to act as a control signal to provide a comparison with the other signal traversing the other lines of the parallel lines. The latches of the modules latch based upon a signal propagation difference between signals propagating on the two parallel lines, allowing for detection of a frequency differential between the two signals propagating in parallel along the two parallel lines.

In operation of PLL 100, frequency control circuit 110 outputs a control signal to control phase comparator 120 over interconnect 115. Phase comparator 120 also receives output from TDC device 150 over interconnect 151 on the feedback path and based on these inputs outputs a control signal to DCO 130 via interconnects 121/127. DCO 130 provides an output signal having a PLL frequency on interconnect 131 based on the control signal input from phase comparator 120.

The frequency output 131 of PLL 100 is connected to the feedback path of PLL 100 via divider 135 and interconnect 137. More particularly, interconnect 137 provides an output signal of PLL 100 from DCO 130 to TDC device 150 on the feedback path of PLL 100. TDC device 150 further receives a reference frequency from reference frequency supply 140 via bus 141. TDC device 150 compares the phase of the reference frequency with the phase of the output signal of PLL 100 and outputs a digital signal indicating the phase difference between the PLL frequency of PLL 100 and the reference frequency to phase comparator 120 which controls DCO 130. The signal may be, for example, a digital word.

In order to provide a precise or accurate phase difference to phase comparator 120, TDC device 150 may be calibrated in a calibration mode in accordance with the disclosure herein. TDC device 150 may be calibrated with calibration module 160 which may provide one or more calibration signals to TDC device 150. Operation of TDC 150 and calibration module 160 will be better understood with reference to FIGS. 2-4

Figure 2:
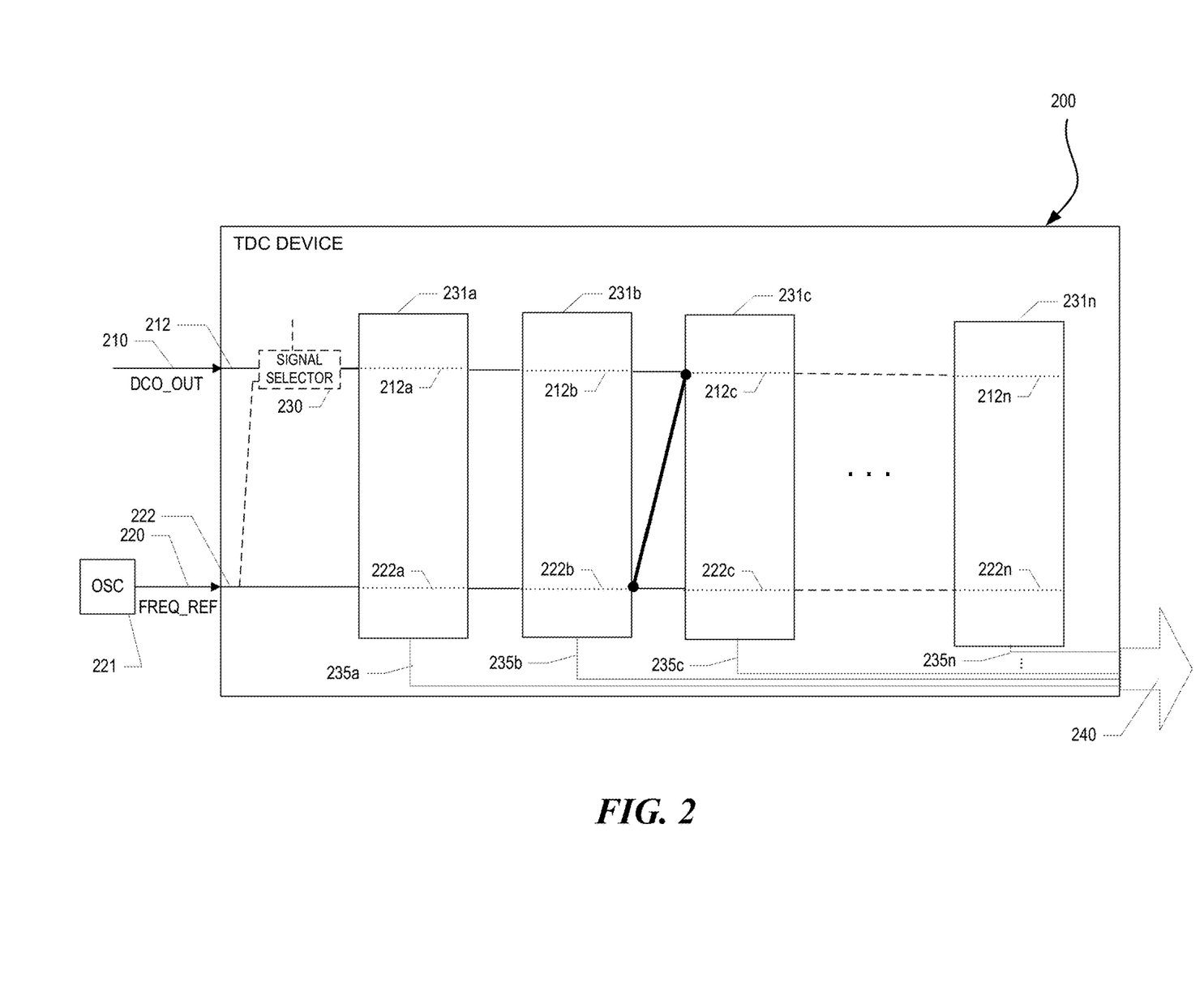
FIG. 2 is an example of a Time to Digital Converter device, in accordance with embodiments disclosed herein.

FIG. 2 illustrates a TDC device 200 that can be implemented discretely or as a portion of another device. According to an embodiment, TDC device 200 can be a specific embodiment of TDC 150 of FIG. 1. As can be seen from FIG. 2, TDC device 200 has a Vernier architecture and as such includes a succession of tiled modules 231a-231n arranged in series. An electrical interconnect 212 and an electrical interconnect 222 traverse the TDC device 200 in parallel between and through each of modules 231a-231n. As further shown, interconnect 212 includes line portions 212a-212n which are portions that traverse modules 231a-231n, respectively, to provide a signal propagation path through modules 231a-231n along interconnect 212. Similarly, interconnect 222 includes line portions 222a-222n which are portions that traverse the modules 231a-231n, respectively, to provide a signal propagation path through modules 231a-231n along interconnect 222. The line portions 212a-212n and 222a-222n can themselves be buffered, as will be better understood in reference to FIG. 3.

Thus, each line portion 212x and 222x traverses its respective module 231x in parallel, and as such are interior line portions of their corresponding module 231x. Module 231x is configured to detect a differential in signal propagation at one or more frequencies along parallel interior line portions 212x and 222x. Each module 231x has an output 235x at which an indication of a differential in signal propagation at one or more frequencies along parallel interior line portions 212x and 222x is provided. The combination of the differential signals at line portions 235a-235n provide a digital time value that can be provided to a phase comparator, such as phase comparator 120 of FIG. 1. In the interest of providing an accurate result at line portions 235a-235n, it is desirable to calibrate the relative capacitances of interior line portions 212x and 222x relative to each other such that respective module 231x accurately or precisely detects a differential in signal propagation at one or more frequencies along parallel interior line portions 212x and 222x.

TDC device 200 can be calibrated according to methods and devices described herein. TDC device 200 receives an input signal labeled DCO_OUT 210 at interconnect 212. The input signal DCO_OUT can also be referred to as the DCO output signal 210, by virtue of being provided by a DCO, such as DCO 130 of FIG. 1. Thus, interconnect 212 may be considered a DCO line, or a DCO frequency line, because it conducts a signal provided by a DCO. TDC 200 also receives an input signal FREQ_REF 220, also referred to herein as frequency reference input 220. FREQ_REF 220 has an associated frequency, and can be provided by a local oscillator 221, which may be a crystal with a resonate control frequency, for example. Input 220 provides an input line 222 with a reference frequency and thus input line 222 may be referred to as reference frequency line 222. Each of modules 231a-231n compares a signal propagation differential along their respective interior line portions and provides a corresponding output signal on outputs 235a-235n as a digital zero or one. The n outputs may be compiled into a digital word output 240 of bit length n that is provided to a phase comparator to control a DCO.

To individually calibrate the modules 231a-231n of TDC 200, DCO frequency line portions 212x and reference frequency line portions 222x traversing each module 231x should be calibrated relative to each other to have equivalent capacitances within a threshold. The individual capacitances of corresponding lines portions 212x and 222x can be calibrated by adding or removing capacitance such that the different propagation delay between the two lines as a signal at a frequency propagates through the respective module along the parallel interior line portions may be controlled within a precision or accuracy threshold. For the purpose of calibrating successive modules, a common signal output of the preceding module, for example, the reference frequency signal, can be provided to both line portion 212 and line portion 222 of a module for calibrating the relative reactances of the two line portions interior to the module to individually calibrate the module.

More particularly, by way of example with regard to individually calibrating module 231c, line portion 212c may be electrically disconnected and thus electrically isolated from the proceeding portion of line 212. Then, line 222 at the output of module 231b (the preceding module) is selectively connected to the input of line portion 212c (shown as the bold connection of FIG. 2) such that the output signal at line 222 from module 231b is provided to both the input of line portion 212c and the input of line portion 222c. This isolation and input selection can be controlled by the calibration module 160.

By virtue of both line portion 212c and 222c receiving the same signal, the reactances or capacitances of lines portions 212c and 222c may be calibrated to provide corresponding signals that propagate through module 231c in parallel. Thus when calibrated, lines portions 212c and 222c have the same capacitance to within a tolerance. Thus, line portions 212c and 222c have the same propagation delay within a threshold based upon that tolerance. This may be indicated by module 231c outputting a binary output of 2. For example, module 231c may include an output arbiter (not shown) that changes states to an output binary 1 from an output binary 0 when lines portions 212c and 222c are calibrated.

While the above has been discussed with regard to using a signal propagated over reference frequency line 222 to calibrate line portions 212x and 222x of a module, this is by way of example. In an alternate embodiment, the signal propagated over DCO frequency line 212 may instead be used to provide the common calibration signal to each of line portions 212c and 222c. With regard to module 231a of FIG. 2, either input 210 or 220 may be used as a common frequency signal to calibrate line portions 212a and 222a relative to each other.

A calibration such as that discussed above with regard to module 231c may be performed for each module 231x of TDC 200. That is, interior line portions 212x and 222x of each of a module 231x may be calibrated as discussed above using a frequency signal provided by the preceding module 231(x−1) and provided to both interior line portions 212x and 222x using a connections such as the bold connection discussed with regard to calibrating module 231c. The initial module, module 231a, can be calibrated by selecting the signal at one of the two input lines 212 or 222.

Figure 3:
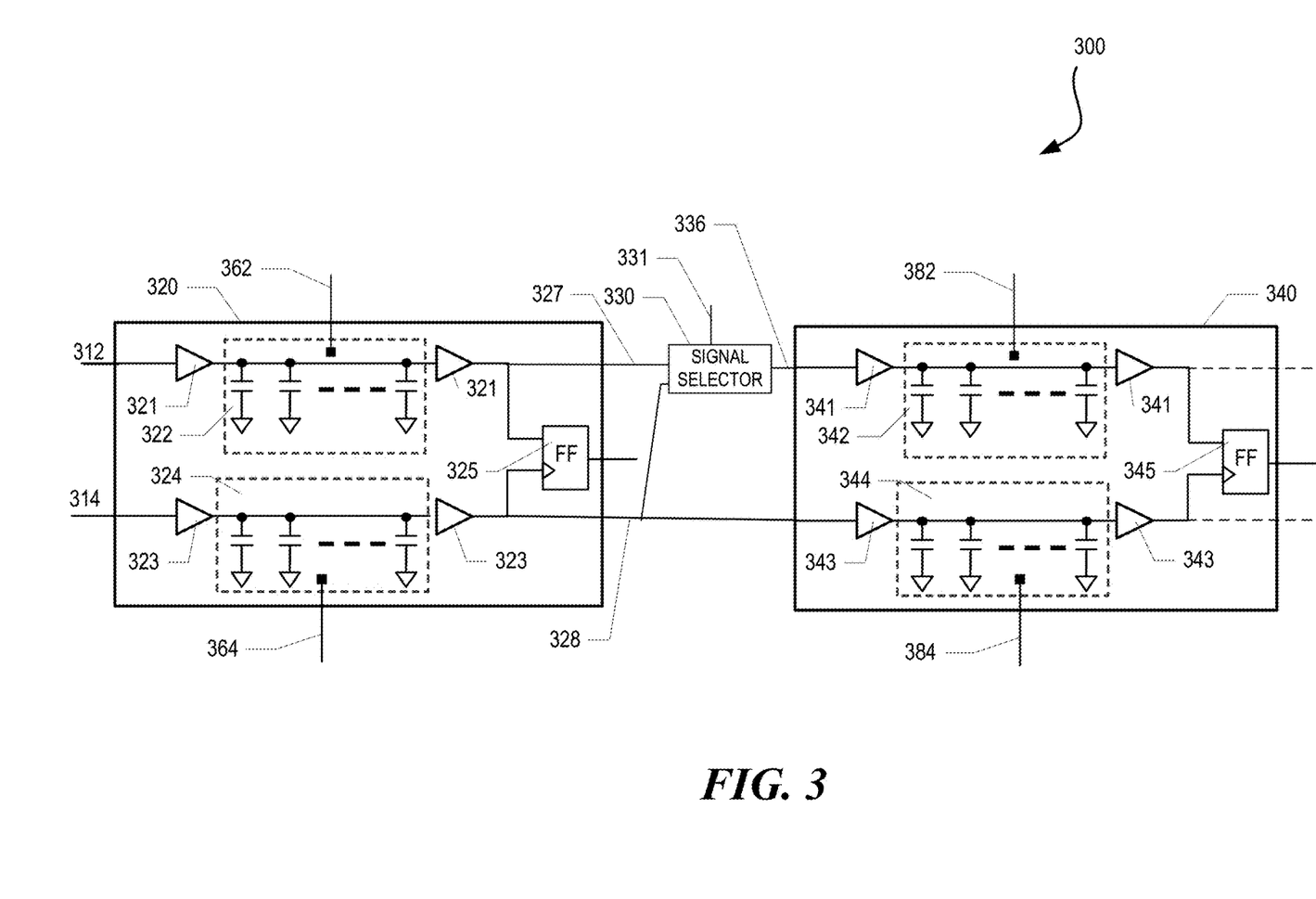
FIG. 3 is an example of a portion of a Time to Digital Converter device, in accordance with embodiments disclosed herein.

FIG. 3 illustrates a portion 300 of a TDC device with Vernier architecture with a mechanism for calibrating a TDC module. More particularly, portion 300 includes a pair of successive modules 320 and 340 connected together to allow for calibration of module 340. Module 320 is selectively connected to module 340 via signal selector 330, which may be implemented, for example, as a multiplexer (MUX) or other selection device. It will be appreciated that module 320 and module 340 of the portion 300 of FIG. 3 can represent any two adjacent modules of modules 231a-231n of FIG. 2. Similarly, it will be appreciated that a signal selector 230 can also reside prior to the initial module 231a, thus allowing either the DCO_OUT signal or the FREQ_REF signal to be provided to both line portions 212a and 222a.

Module 320 receives the DCO signal at DCO signal input 312 and reference frequency signal at reference frequency input 314. As can be seen from FIG. 3, the DCO signal and the reference frequency traverse parallel lines of module 320 before being provided to interconnects 327 and 328, respectively. The DCO signal line of module 320 includes a pair of buffers 321 isolating a set of tuning capacitances 322, each of which can be selectively connected to the DCO signal line to calibrate a capacitance (and hence reactance, and thus delay) of the DCO signal line within a threshold. Similarly, the reference frequency line includes a pair of buffers 323 isolating a set of tuning capacitances 324 which may be selectively connected to the reference frequency line to calibrate a capacitance of the reference frequency line. Flip-flop 325 is connected to both the DCO signal line and the reference frequency line subsequent to buffers 321, 323 and tuning capacitances 322, 324. Flip-flop 325 detects a delay difference between the DCO signal line and the reference frequency line within a tolerance and outputs a 0 or 1, such as at interconnect 235b of FIG. 2. Flip-flop 325 is an example implementation of an arbiter indicating a change in state of module 320 and may have an accuracy on the order of 1 ps.

A calibration line 362 is connected to the set of tuning capacitances 322 and may control adding or removing individual capacitances of the set of tuning capacitances 322. Similarly, a calibration line 364 is connected to the set of tuning capacitances 324 and may control adding or removing individual capacitances of the set of tuning capacitances 324. Calibration lines 362 and 364 may be controlled by a calibration module such as calibration module 160 of FIG. 1.

As shown, interconnect 327 provides the DCO signal from module 320 and is connected to a first input of signal selector 330. Interconnect 328 provides the reference signal from module 320 and is connected to the reference frequency input of module 340 and to a second input of signal selector 330. An output of signal selector 330 is connected to the DCO signal input of module 340 via interconnect 336. A calibration signal is provided to a control input of signal selector 330 via interconnect 331. When the calibration signal received at the control input of signal selector 330 indicates an operational mode of the TDC, as opposed to a calibration mode, signal selector 330 selectively provides the DCO signal at interconnect 327 to interconnect 336, thus providing the DCO signal as input to module 340. When the calibration signal received at the control input of signal selector 330 indicates a calibration mode of the TDC, signal selector 330 selectively provides the reference frequency signal from interconnect 328 to interconnect 336, thus providing the reference frequency to both the DCO input and the frequency reference input of module 340. Thus providing for calibration of the DCO signal line and the reference frequency line of module 340.

Module 340 receives the signal selected by signal selector 330 at interconnect 336 as input to the DCO signal line of module 340. As can be seen from FIG. 3, the selection signal and the reference frequency traverse parallel lines of module 340 before being output to the immediately succeeding module of the TDC (shown as dashed lines). The DCO signal line of module 340 includes a pair of buffers 341 isolating a set of tuning capacitances 342 which may be selectively connected to the DCO signal line to calibrate a capacitance of the DCO signal line. Similarly, the reference frequency line includes a pair of buffers 343 isolating a set of tuning capacitances 344 which may be selectively connected to the reference frequency line of module 340 to calibrate a capacitance of the reference frequency line. Flip-flop 345 is connected to both the DCO signal line and the reference frequency line subsequent to buffers 341, 343 and tuning capacitances 342, 344. Flip-flop 345, which can also be referred to as an arbiter, detects a delay difference between the DCO signal line and the reference frequency line within a tolerance (for example, 1 ps) and provides a 0 or 1 at its output, which can be interconnect 235c of FIG. 2, for example. This signal can be provided to a calibration module that will change the capacitance value of one or more of the DCO signal line and the reference frequency line until the state of the arbiter changes. Flip-flop 325 is an example implementation of an arbiter that indicates a change in state of module 340 that can include other components as needed to detect a signal difference between the DCO signal line and the reference frequency line.

A calibration line 382 is connected to the set of tuning capacitances 342 and may control adding or removing individual capacitances of the set of tuning capacitances 342. Similarly, a calibration line 384 is connected to the set of tuning capacitances 344 and may control adding or removing individual capacitances of the set of tuning capacitances 344. Calibration lines 382 and 384 may be controlled by a calibration module such as calibration module 160 of FIG. 1.

Figure 4:
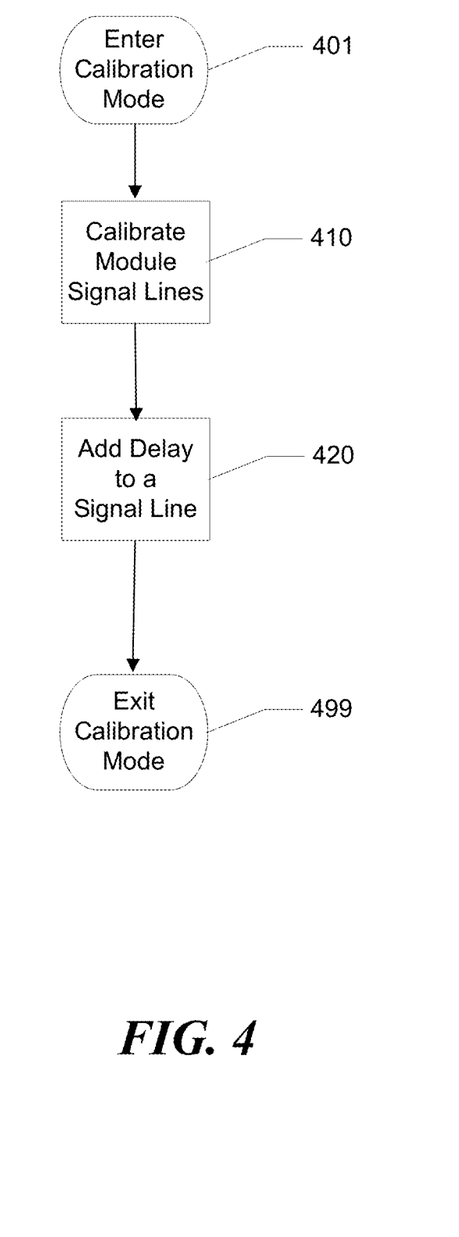
FIG. 4 is an example of a method for calibrating a portion of a Time to Digital Converter device, in accordance with embodiments disclosed herein.

FIG. 4 illustrates a method of calibration operation of portion 300 of FIG. 3, and more particularly, an embodiment of calibrating module 340.

At 401, a calibration mode is entered. In 401, a calibration signal is provided to signal selector 330 via selection control input 331. As a result, signal selector 330 provides the reference frequency signal at interconnect 328 to interconnect 336, thus providing the reference frequency to both inputs of module 340 for calibration of the DCO signal line and the reference frequency line of module 340.

At 410, the DCO signal line and the reference frequency line of module 340 are calibrated relative to each other. This can be accomplished by the calibration module selecting different capacitors of variable capacitors 342 and 344 to change the capacitance, and hence the delay, of the DCO signal line or the reference frequency line of module 340 until flip-flop 345 changes states, for example, outputs a 1, indicating that flip-flop 345 registers comparable propagation times within a threshold (determined by the tolerance of flip-flop 345, for example 1 ps) for the signals propagating over both the DCO signal line and the reference frequency line of module 340. In one example of this calibration, individual tuning capacitances of set of tuning capacitances 342 are systematically selectively connected from the DCO signal line of module 340 until the DCO signal line has the same propagation delay due to reactance as the reference frequency line of module 340 within the threshold, as may be indicated by an output of flip-flop 345 changing output.

At 420, a signal propagation delay can be added to one of the DCO signal line or the reference frequency line of module 340. The signal propagation delay may be a desired delay. For example, individual tuning capacitances of set of tuning capacitances 342 are systematically selectively connected from the DCO signal line of module 340 until the DCO signal line providing a fixed, known, and desired propagation delay relative to the reference frequency line of module 340 within a tolerance. The signal propagation delay is based on the time resolution of the TDC, so in applications, the added signal propagation delay may be in the order of a few picoseconds. It will be appreciated, therefore, that the actual incremental capacitance that can be added is a function of the threshold tolerance of the arbiter, e.g., 1 ps in the present example, and the design characteristics of the DCO and reference frequency lines.

At 499, the calibration mode is exited. In 499, an operation signal is provided to signal selector 330 via selection control input 331. As a result, signal selector 330 selectively connects interconnect 327 to interconnect 336 and deselects interconnect 328 from interconnect 336 to provide the DCO signal from interconnect 327 to the DCO signal line of module 340 during operation of module 340 and the corresponding TDC. In addition, upon exiting the calibration mode, a capacitance select signal for each module is maintained and provided to its corresponding module during normal operation to implement calibrated modules.

In implementations, a signal selector may be positioned before each module of a TDC to provide a common signal to both input lines of the module during calibration of the module. In such an embodiment, the selection control input for signal selectors corresponding to the modules may be asserted individually to individually calibrate modules over time, or may be asserted in parallel to allow for the modules or sets of modules in a TDC to be individually calibrated together in parallel. For example, referring to FIG. 2, reference frequency line 222 may provide an unbroken propagation path traversing modules 231a-231n for the reference frequency provided by oscillator 221. Then, interior line portions 212x may each be individually calibrated in parallel by adjusting capacitance using the reference frequency provided by reference frequency line 222 to individually calibrate modules 231a-231n in parallel.

Alternatively, a signal selector may be positioned before a set of two or more modules and used to sequentially calibrate the modules in their sequential order in series. That is, first the module immediately succeeding the signal selector would be calibrated; subsequently, the module succeeding the calibrated module would be calibrated, and so on in succession, until the set of modules is calibrated.

As would be understood by one of skill in the art, a set of tuning capacitances may include a set of capacitors that may be selectively connected from a line by digitally-controlled switches individually controlled. The DCO signal line as discussed above may be considered a device signal line receiving a signal with a frequency from a device which may be a radio frequency circuit or part of a radio frequency circuit such as a PLL loop.

The concepts of the present disclosure have been described above with reference to specific embodiments. However, one of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Embodiments of a TDC may include a plurality of modules arranged with a Vernier architecture, the plurality of modules including a first module and a second module, each module comprising a first input to receive an input frequency signal having a particular frequency, a second input to receive an input reference frequency to be compared to the input frequency signal, a first output to provide an output frequency signal based on the input frequency signal, and a second output to provide an output reference frequency signal. The TDC may be configured with a signal selector comprising a first input coupled to the first output of the first module, a second input coupled to the second output of the first module, a select line to selectively provide a signal at one of the first and second inputs of the signal selector to an output of the signal selector, the output of the signal selector coupled to one of the first input of the second module and the second input of the second module.

The second module may include a first set of tuning capacitances configured to be selectively connected to a one of a signal line or a reference frequency line traversing the second module to modify a capacitance of the one of the signal line or the reference frequency line. The second module may further include a first pair of buffers coupled to the device frequency line to isolate the first set of tuning capacitances. The second module may further include a second set of tuning capacitances configured to be coupled or uncoupled to a one of a signal line or a reference frequency line traversing the second module to modify a capacitance of the one of the signal line or the reference frequency line. The second module may include a second pair of buffers coupled to the reference frequency line to isolate the second set of tuning capacitances. The second module may include an arbiter coupled to the device frequency line subsequent to the first set of tuning capacitances.

The TDC may additionally include a preceding signal selector with a first input, a second input, and an output, where the preceding signal selector immediately precedes the first module and the output of the preceding signal selector is coupled to a device frequency line of the first module and a reference frequency signal is coupled to the second input and a reference frequency input of the first module. And the TDC may include a third set of tuning capacitances configured to be coupled or uncoupled to a device frequency line of the first module in a region of the device frequency line of the first module to modify a capacitance of the device frequency line of the first module.

A PLL circuit may utilize a TDC as described herein. Such a PLL circuit may include a phase comparator, a controlled oscillator configured to generate a first signal at a first frequency, and a TDC. The TDC may be coupled to the controlled oscillator and have a Vernier architecture. The TDC may include a first circuit configured to output a device frequency signal on a first conductor and a reference frequency signal on a second conductor, a succeeding circuit succeeding the first circuit and comprising a device frequency line and a reference frequency line, and a succeeding signal selector with a first input, a second input, and an output, wherein the output is coupled to the reference frequency line, the first input is coupled to the first conductor and the second input is coupled to the second conductor.

The TDC may include a first set of tuning capacitances configured to be coupled or uncoupled to a one of the device frequency line or reference frequency line to modify a capacitance of the one of the device frequency line or reference frequency line. The TDC may include a first pair of buffers coupled to the device frequency line to isolate the first set of tuning capacitances. The TDC may include a second set of tuning capacitances configured to be coupled or uncoupled to a one of the device frequency line or the reference frequency line to modify a capacitance of the one of the device frequency line or reference frequency line. The TDC may include an arbiter coupled to the device frequency line subsequent to the first set of tuning capacitances.

The TDC may further include a preceding signal selector with a first input, a second input, and an output, where the preceding signal selector immediately precedes the first circuit and the output of the preceding signal selector is coupled to a reference frequency line of the first circuit and a reference frequency signal is coupled to the second input and a reference frequency input of the first circuit. And the TDC may also include a third set of tuning capacitances configured to be coupled or uncoupled to the device frequency line of the first circuit in a region of the device frequency line of the first circuit to modify a capacitance of the device frequency line of the first circuit.

A TDC example with Vernier architecture may include a set of modules arranged in series succession, each of the modules having a first signal line traversing the module and a second signal line traversing the module. The TDC may include a set of signal selectors arranged in series succession and interposed between the modules, each signal selector having a first input, a second input, and an output, where the first input is coupled to receive a first signal from the first signal line of an immediately preceding module and the second input is coupled to receive a second signal from the second signal line of the preceding module and the signal selector is configured to select one of the first or second signals to provide to the first signal line of an immediately succeeding module.

A method according to the disclosure provided herein may include calibrating a time to digital converter (TDC) having a plurality of modules arranged with a Vernier architecture including a first module and a second module, each module comprising a first input to receive an input frequency signal having a particular frequency, a second input to receive an input reference frequency to be compared to the input frequency signal, a first output to provide an output frequency signal based on the input frequency signal, and a second output to provide an output reference frequency signal. The method may include decoupling the first output of the first module from the first input of the second module with a signal selector upon entering a calibration mode, the signal selector comprising a first input coupled to the first output of the first module, a second input coupled to the second output of the first module. The method may then include connecting the second output of the first module to the first input of the second module with the signal selector in response to a calibration signal being provided to the signal selector upon entering the calibration mode.

The method may include selectively connecting tuning capacitances of a first set of tuning capacitances to a one of a device signal line or a reference frequency line traversing the second module to modify a capacitance of the one of the device signal line or the reference frequency line. And the method may include selectively connecting tuning capacitances of a second set of tuning capacitances to a one of a device signal line or a reference frequency line traversing the second module to modify a capacitance of the one of the device signal line or the reference frequency line.

The use of the same reference symbols in different drawings indicates similar or identical items.

The invention claimed is:

1. A time to digital converter (TDC) comprising:
a plurality of modules arranged with a Vernier architecture, the plurality of modules comprising at least a first module and a second module, each module of the plurality of modules comprising a first input configured to receive an input device signal having a particular frequency, a second input configured to receive an input reference frequency signal to be compared to the input device signal, a first output configured to provide an output device signal based on the input device signal, and a second output configured to provide an output reference frequency signal based on the input reference frequency signal; and
a signal selector comprising a first input coupled to the first output of the first module, a second input coupled to the second output of the first module, and a select line configured to provide a control signal to select one of the first and second inputs of the signal selector to generate an output signal at an output of the signal selector, wherein the output of the signal selector is coupled to the first input of the second module and the second output of the first module is coupled the second input of the second module,
wherein the second module comprises a set of tuning capacitors configured to be selectively connected to one of a device signal line of the second module or a reference frequency line of the second module to modify a capacitance of the one of the device signal line or the reference frequency line of the second module.

2. The TDC of claim 1, wherein the second module further comprises an arbiter coupled to the device signal line of the second module and the reference frequency line of the second module, subsequent to the set of tuning capacitors.

3. The TDC of claim 1, further comprising a preceding signal selector having a first input, a second input, and an output, wherein the preceding signal selector immediately precedes the first module, the first input of the preceding signal selector is configured to receive an initial input device signal, the second input of the preceding signal selector is configured to receive an initial input reference frequency signal, and the output of the preceding signal selector is coupled to the first input of the first module.

4. The TDC of claim 3, wherein the first module further comprises an arbiter coupled to the device signal line of the first module and to the reference frequency line of the first module, interior to the first module and subsequent to a set of tuning capacitors of the first module.

5. A circuit, comprising:
a phase comparator;
a controlled oscillator coupled to the phase comparator and configured to generate a first signal at a first frequency; and
a time to digital converter (TDC) with a Vernier architecture, the TDC coupled to the phase comparator and the controlled oscillator, wherein the TDC comprises:
a first circuit configured to output a device signal based on the first signal from the controlled oscillator and a reference frequency signal,
a succeeding circuit succeeding the first circuit and comprising a device signal line and a reference frequency line, and
a succeeding signal selector having a first input, a second input, and an output, wherein the output of the succeeding signal selector is coupled to one of the device signal line and the reference frequency line, the first input of the succeeding signal selector is configured to receive the device signal, and the second input of the succeeding signal selector is configured to receive the reference frequency signal, wherein the succeeding circuit comprises a set of tuning capacitors configured to be coupled or uncoupled to one of the device signal line or the reference frequency line to modify a capacitance of the one of the device signal line or the reference frequency line.

6. The circuit of claim 5, wherein the succeeding circuit further comprises an arbiter coupled to the device signal line and the reference frequency line, subsequent to the set of tuning capacitors.

7. The circuit of claim 5, wherein the TDC further comprises a preceding signal selector having a first input, a second input, and an output, wherein the preceding signal selector immediately precedes the first circuit, the first input of the preceding signal selector is configured to receive an input device signal, the second input of the preceding signal selector is configured to receive an input reference frequency signal, and the output of the preceding signal selector is coupled to a device signal line of the first circuit.

8. The circuit of claim 7, wherein the first circuit comprises a reference frequency line, and an arbiter coupled to the device signal line of the first circuit and the reference frequency line of the first circuit, interior to the first circuit and subsequent to a set of tuning capacitors of the first circuit.

9. A method comprising:
entering a calibration mode for calibrating a time to digital converter (TDC) having a plurality of modules arranged with a Vernier architecture, comprising at least a first module and a second module, each module of the plurality of modules comprising a first input configured to receive an input device signal having a particular frequency, a second input configured to receive an input reference frequency signal to be compared to the input device signal, a first output configured to provide an output device signal based on the input device signal, and a second output configured to provide an output reference frequency signal based on the input reference frequency signal;
decoupling the first output of the first module from the first input of the second module by a signal selector upon entering the calibration mode, the signal selector comprising a first input coupled to the first output of the first module, a second input coupled to the second output of the first module;
connecting the second output of the first module to the first input of the second module by the signal selector in response to a calibration signal being provided to the signal selector upon entering the calibration mode; and
selectively connecting tuning capacitances of a set of tuning capacitors of the second module to one of a device signal line traversing the second module or a reference frequency line traversing the second module to modify a capacitance of the one of the device signal line traversing the second module or the reference frequency line traversing the second module.

10. The method of claim 9, wherein a pair of buffers of the second module is coupled to the device signal line traversing the second module to isolate the set of tuning capacitors.

11. The method of claim 9, further comprising selectively connecting tuning capacitances of a second set of tuning capacitors to one of the device signal line or the reference frequency line traversing the second module to modify a capacitance of the one of the device signal line or the reference frequency line traversing the second module.

12. The method of claim 11, wherein an arbiter is coupled to the device signal line and the reference frequency line subsequent to the set of tuning capacitors.

* * * * *